United States Patent
Chen et al.

(10) Patent No.: US 8,565,368 B1
(45) Date of Patent: Oct. 22, 2013

(54) WIDE RANGE MULTI-MODULUS DIVIDER IN FRACTIONAL-N FREQUENCY SYNTHESIZER

(75) Inventors: Juinn-Yan Chen, Fremont, CA (US); San-Chieh Chou, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 8 days.

(21) Appl. No.: 13/481,489

(22) Filed: May 25, 2012

(51) Int. Cl.
*H03K 21/00* (2006.01)
*H03K 23/00* (2006.01)

(52) U.S. Cl.
USPC .............................................. 377/47; 377/48

(58) Field of Classification Search
None
See application file for complete search history.

(56) References Cited

U.S. PATENT DOCUMENTS

| | | | | |
|---|---|---|---|---|
| 5,195,111 | A * | 3/1993 | Adachi et al. | 377/52 |
| 6,009,139 | A * | 12/1999 | Austin et al. | 377/47 |
| 6,750,686 | B2 * | 6/2004 | Wang | 327/115 |
| 6,760,397 | B2 * | 7/2004 | Wu et al. | 377/47 |
| 6,970,025 | B2 * | 11/2005 | Magoon et al. | 327/115 |
| 7,042,257 | B2 * | 5/2006 | Wang | 327/115 |
| 7,215,211 | B2 | 5/2007 | Lipan et al. | |
| 7,298,810 | B2 * | 11/2007 | Ke | 377/48 |
| 7,564,276 | B2 * | 7/2009 | Narathong et al. | 327/117 |
| 7,760,844 | B2 | 7/2010 | Ding et al. | |
| 7,826,563 | B2 | 11/2010 | An et al. | |

OTHER PUBLICATIONS

Raja K.K.R. Sandireddy et al., "A Generic Architecture for Multi-Modulus Dividers in Low-Power and High-Speed Frequency Synthesis," 2004 Topical Meeting on Silicon Monolithic Integrated Circuits in RF Systems, 2004, pp. 243-246.

Ko-Chi Kuo, "A 2.4 GHz Low Phase Noise Frequency Synthesizer for WiMAX Applications," IEICE Electronics Express, 2011, vol. 8, No. 12, pp. 938-943.

Anqiao Hu, "Multi-Modulus Divider in Fractional-N Frequency Synthesizer for Direct Conversion DVB-H Receiver," A Thesis, Presented in Partial Fulfillment of the Requirements for the Degree Master of Science in the Graduate School of The Ohio State University, 2007, 68 pages.

* cited by examiner

*Primary Examiner* — Tuan T Lam
(74) *Attorney, Agent, or Firm* — Van Pelt, Yi & James LLP (57) ABSTRACT

A multi-modulus divider includes a chain of n dual modulus divider cells in cascade and connected in a ripple configuration where the last (n-k) of the divider cells are state-parked dual modulus divider cells. The state-parked dual modulus divider cells are forced to a given logical state when the divider cell is bypassed. The state-parked dual modulus divider cells ensure that the multi-modulus divider can change between different number of cells without clock glitches or clock errors. The multi-modulus divider is therefore capable of achieving a wide division range with seamless transition between division ratios.

12 Claims, 6 Drawing Sheets

WIDE RANGE MULTI-MODULUS DIVIDER IN FRACTIONAL-N FREQUENCY SYNTHESIZER

FIELD OF THE INVENTION

The invention relates to frequency or clock dividers and, in particular, to a multi-modulus frequency/clock divider with an extended and continuous division range.

DESCRIPTION OF THE RELATED ART

The advent of wireless communication leads to increasing demands on wireless communication devices to comply with increasingly complicated communication specifications. A wireless communication device transmits and receives modulated radio frequency (RF) signals, generally in accordance with one or more telecommunication standards. Wireless communication devices typically include a frequency synthesizer to generate the desired modulation frequency for the radio frequency (RF) transmitter and RF receiver. In order to cover multiple frequency bands and to meet the demand of fine frequency step size, fractional-N frequency synthesizers are often employed. Fractional-N frequency synthesizers formed using multi-modulus dividers are capable of generating output frequencies having a fine resolution. However, conventional fractional-N frequency synthesizers constructed to cover a wide division range often suffer from frequency errors in operation when the division ratio changes leads to changes in the number of selected divider cell.

SUMMARY OF THE INVENTION

According to one embodiment of the present invention, a multi-modulus divider receiving an input clock signal and generating a divided down clock signal including n dual modulus divider cells connected in cascade and ripple configuration where the first k out of n divider cells include k basic dual modulus divider cells and the last (n-k) divider cells include (n-k) state-parked dual modulus divider cells being able to be bypassed. Each state-parked dual modulus divider cells receive a control signal to set the state-parked dual modulus divider cell to a predetermined logical state when the state-parked dual modulus divider cell is being bypassed. the multi-modulus divider further includes a multiplexer having input terminals receiving an output clock signal from the kth divider cell and output clock signals from each of the (n-k) state-parked dual modulus divider cells. The multiplexer receives a selection signal to select one of the output clock signals as the divided-down clock signal. The divided-down clock signal is generated based on the input clock signal and a division ratio where the division ratio determines if one or more (n-k) state-parked dual modulus divider cells are to be bypassed. The control signal to set the state-parked dual modulus divider cell to a predetermined logical state and the selection signal of the multiplexer are derived from programmability bits provided to each divider cell to select the division factor of the dual modulus divider cells.

According to another aspect of the present invention, a method for performing frequency division using a multi-modulus divider includes providing n dual modulus divider cells connected in cascade and ripple configuration with the last (n-k) divider cells being able to be bypassed; providing a control signal to set one or more of the last (n-k) divider cells to a predetermined logical state based on programmability bits provided to each divider cell to select the division factor of the dual modulus divider cells; in response to the control signal, setting one or more of the last (n-k) divider cells to a predetermined logical state when the one or more divider cells are being bypassed; selecting an output clock signal from the kth divider cell and output clock signals from each of the last (n-k) divider cells as the divided-down clock signal in response to a selection signal, the selection signal being derived from the programmability bits; and generating the divided-down clock signal based on the input clock signal and a division ratio, the division ratio determining if one or more of the last (n-k) divider cells are to be bypassed.

The present invention is better understood upon consideration of the detailed description below and the accompanying drawings.

DETAILED DESCRIPTION OF THE PREFERRED EMBODIMENTS

In accordance with the principles of the present invention, a multi-modulus divider for a fractional-N frequency synthesizer includes a chain of n dual modulus divider cells in cascade and connected in a ripple configuration where the last (n-k) of the divider cells are state-parked dual modulus divider cells. The state-parked dual modulus divider cells ensure that the divider can change between different number of cells without clock glitches or clock errors. The multi-modulus divider is therefore capable of achieving a wide division range with seamless transition between division ratios, particularly when changing division ratios require selecting different numbers of divider cells.

The multi-modulus divider of the present invention realizes many advantages over conventional dividers. While it is known to form a multi-modulus divider using dividers cells that can be bypassed to increase the division range, such conventional multi-modulus dividers often suffer from clock errors due to glitches that can occur during the change-over time when different number of divider cells are selected. The multi-modulus divider uses state-parked divider cells to ensure a smooth and glitch-free transition between different numbers of divider cells. In this manner, the multi-modulus divider of the present invention is capable of achieving a wide division range using changing number of divider cells.

Furthermore, by configuring the last divider cells as the state-parked divider cells, the divider operates on the slowest frequency during cell selection changes. The cell selection circuitry therefore requires lower speed control signals, that is, control signals not at the highest clock frequency of the divider. The low-speed control signal can be generated readily using simple combinational circuitry which does not need to operate at the highest frequency. The multi-modulus divider of the present invention represents an improvement over conventional dividers that use the highest clock frequency to recover from glitches. Conventional dual modulus dividers with bypass divider cells often require complex and high speed circuitry.

Figure 1:
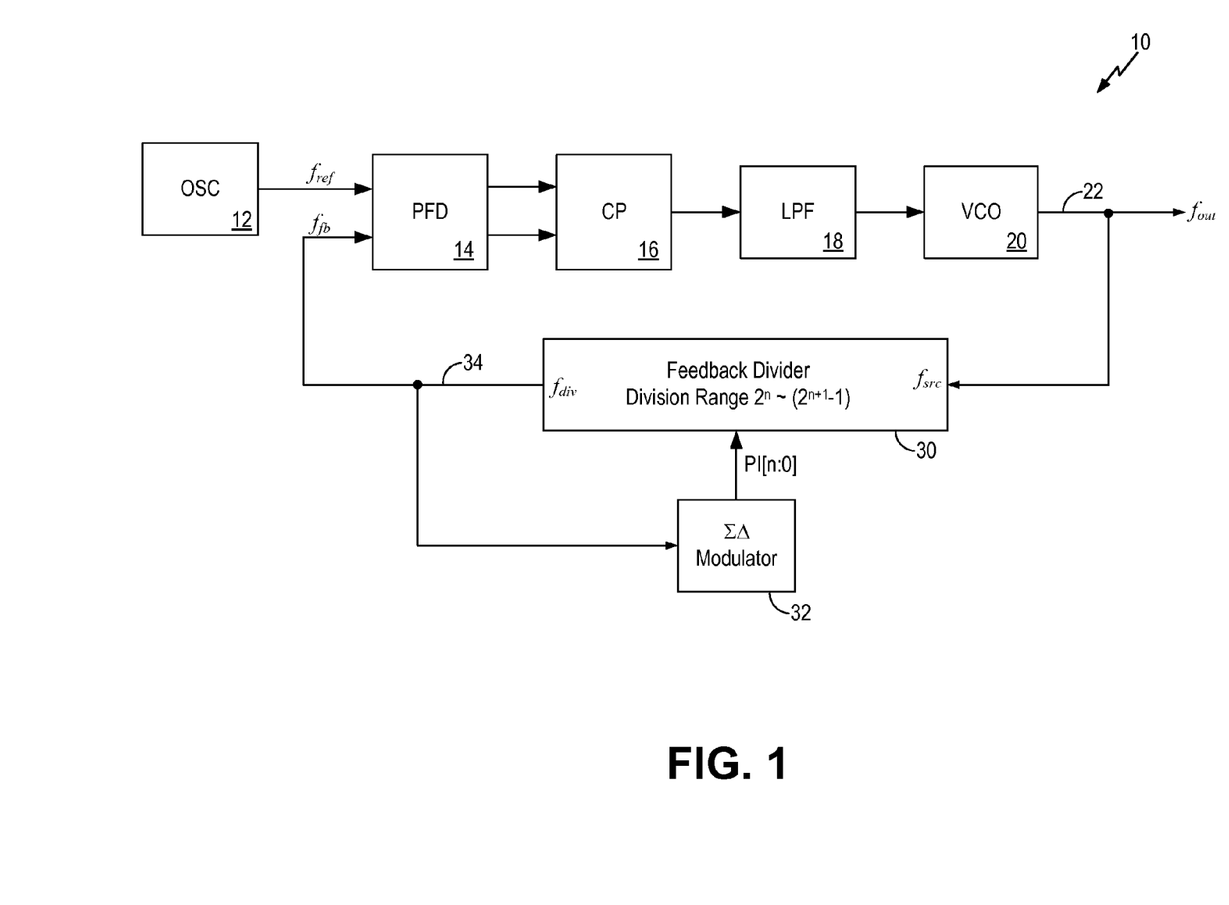
FIG. 1 is a schematic diagram of a fractional-N frequency synthesizer incorporating a multi-modulus divider in embodiments of the present invention.

FIG. 1 is a schematic diagram of a fractional-N frequency synthesizer incorporating a multi-modulus divider in embodiments of the present invention. Referring to FIG. 1, a fractional-N frequency synthesizer 10 is formed using a basic phase-locked loop (PLL) structure including a phase detector 14, a charge pump 16, a low pass filter 18 and a voltage controlled oscillator (VCO) 20. Instead of using a unity feedback as in a basic PLL, a feedback divider 30 is used in the feedback path. The feedback divider is implemented as a multi-modulus divider with a division ratio N, also referred to as the modulus of the divider 30. Accordingly, the output frequency $f_{out}$ is N times the reference frequency $f_{ref}$, given as: $f_{out}=N*f_{ref}$. In a fractional synthesizer, the output frequency $f_{out}$ is a fraction of the input reference frequency $f_{ref}$ and the divider ratio N includes an integer part and a fractional part. As a multi-modulus divider, the feedback divider 30 is implemented as a chain of n divider cells and has a division range of $2^n$ to $(2^{n+1}-1)$.

In operation, the reference frequency $f_{ref}$ is generated from a highly accurate and stable frequency source, such as a crystal oscillator 12. The reference frequency $f_{ref}$ is typically a high frequency signal and is divided down by the feedback divider 30 to a desired lower frequency as the output frequency $f_{out}$. The output frequency $f_{out}$ is locked to the reference frequency $f_{ref}$ through the PLL. The feedback divider 30 receives the output frequency $f_{out}$ as the input source frequency $f_{src}$ and generates a divided down frequency $f_{div}$ as the feedback frequency $f_{fb}$ to the PLL. The output frequency $f_{out}$ is adjusted by changing the division ratio N of the feedback divider 30. Fine frequency step size can be achieved by constantly swapping the feedback division ratio N between integer numbers.

More specifically, the division ratio N of the feedback divider 30 is modulated by a delta-sigma ($\Sigma\Delta$) modulator 32. The delta-sigma modulator 32 generates programmability bits PI[n:0] to control the division factor of the divider cells in the divider 30 to realize the desired division ratio N for the divider 30. The delta-sigma modulator 32 receives the feedback frequency $f_{fb}$ and the programmability bits are generated synchronous to the feedback frequency $f_{fb}$. In practice, the delta-sigma modulator 32 randomizes the choice of the modulus between integers D and D+1 to generate the fractional division ratio N. The noise shaping effect of the delta-sigma modulator pushes the phase noise to a high level which can be filtered out by the LPF 18.

The feedback divider 30 in the fractional-N frequency synthesizer 10 should be capable of supporting very high input source frequency $f_{src}$ from the VCO 20. Furthermore, changes in the division ratio N of the feedback divider 20 should be in sync with the divided down frequency $f_{div}$ used as the feedback frequency $f_{fb}$ to the PLL.

Figure 2:
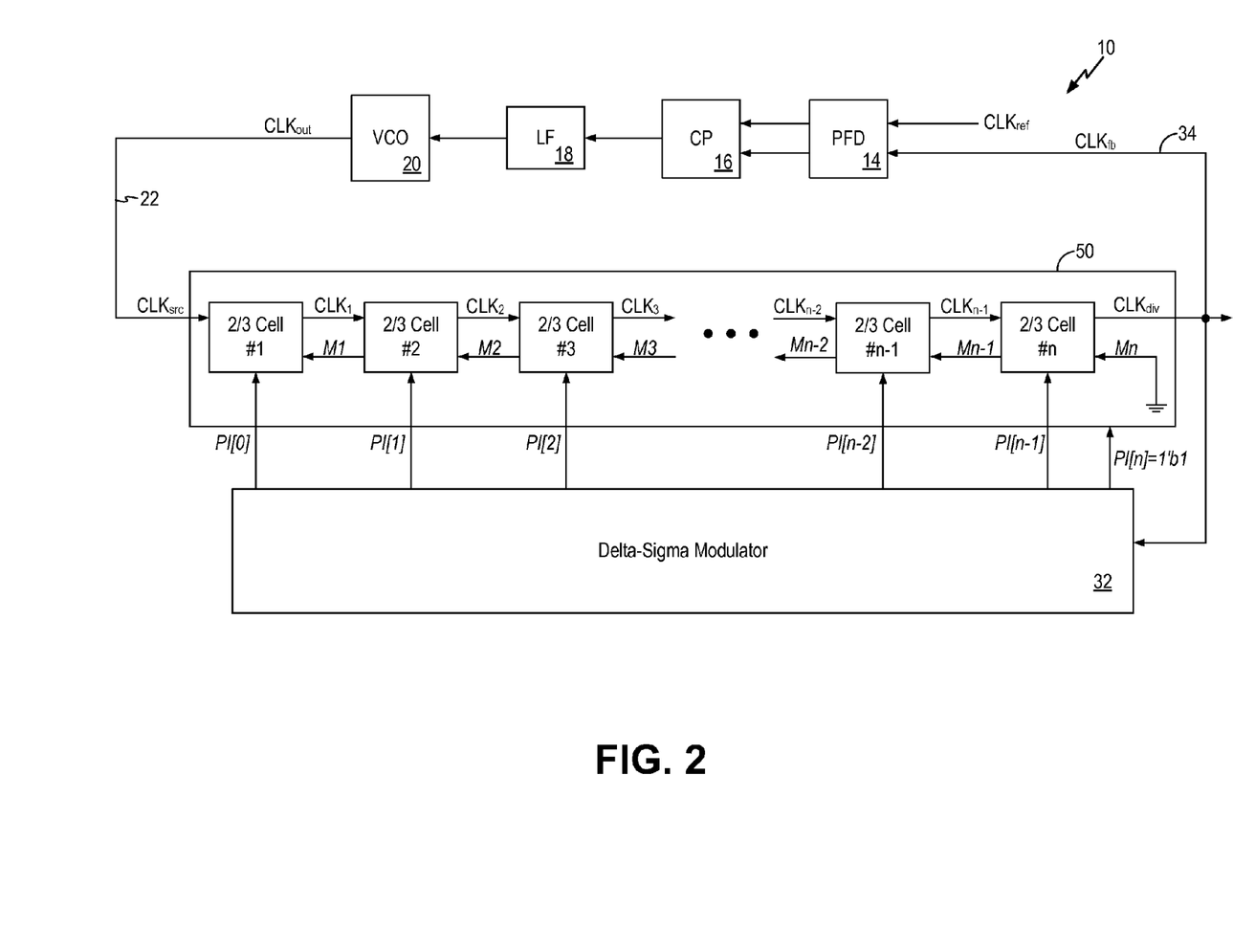
FIG. 2 illustrates a conventional chain architecture for a feedback divider in a fractional-N frequency synthesizer.

FIG. 2 illustrates a conventional chain architecture for a feedback divider in a fractional-N frequency synthesizer. Referring to FIG. 2, a feedback divider 50 is a multi-modulus divider formed by cascaded divider cells connected in a ripple configuration. More specifically, the multi-modulus divider 50 is formed by a chain of n dual modulus divider cells in cascade and connected in a ripple configuration. The first cell (#1) receives the input source clock $CLK_{src}$ from the VCO 20 and divide the incoming clock and generates an output clock $CLK_1$ for the next cell (#2). The clock signal propagates up the chain to the last cell (#n) which generates the divided down clock signal $CLK_{div}$ which can be used as the feedback clock $CLK_{fb}$ for the phase detector 14. Meanwhile, the last cell (#n) generates the modulus signal Mn−1 for the previous cell (#n−1) and the modulus signal propagates down the chain to the first cell (#1) as modulus value M1.

The dual modulus divider cells, also referred to as dual modulus prescalers, are configured to divide by a division factor of P or P+1 and are referred to as P/(P+1) divider cell. In the present illustration, the dual modulus divider cells are 2/3 divider cells with a division factor of 2 or 3. The delta-sigma modulator 32 generates the programmability bit PI[n:0] for each divider cell to select the desired division factor of the divider cell. In operation, the multi-modulus divider 50 divide by P for A output pulses and divided by P+1 for B output pulses. The equivalent division ratio varies between P and P+1 in fine steps by choosing appropriate values for A and B. In this manner, a fractional division ratio is realized.

The division of the clock signal in multi-modulus divider 50 operates as follows. In every division period, the last cell (#n) of the divider in the chain generates modulus signal Mn−1 having a logical high value. The modulus signal then propagates up the chain to the first cell (#1). An active modulus signal (logical high) would enable a divider cell #x to divide by 3 (or P+1) once in a division cycle, as long as the programmable bit PI[x] is also set to 1. In other words, a divide-by-2/3 cell (#x) will divide by two during non-activated period when modulus signal Mx is not active (logical low). As the modulus signal propagates down the chain, each divider cell in the chain will be activated only once by the active modulus signal Mx for a complete division cycle. A divide-by-2/3 cell (#x) would divide by three only once in a whole division cycle, if the divider cell gets enabled to do so by having both the programmability bit PI[x] and the modulus signal Mx enabled. That is, a divider cell #x would divide by three when the modulus signal Mx is active (logical high) and the programmability bit PI[x] is active (logical high). For the rest of the division cycle, the cell divides the input clock by two.

As thus configured, the division-by-three action in the multi-modulus divider 50 only adds one extra period of each cell's input signal to the period of the output signal. For example, each divide-by-three action in a cell with a 2.5 GHz (0.4 ns period) input clock would introduce an extra 0.4 ns to the period of the output clock. The output period then becomes 1.2 ns instead of 0.8 ns for a division-by-two cell.

The chain architecture shown in FIG. 2 can be configured to cover different division range by using different numbers of dividers cells. For example, a multi-modulus divider including five dividers cells can realize a division range of 32 to 63; a multi-modulus divider including six dividers cells can realize a division range of 64 to 127; and a multi-modulus divider including seven dividers cells can realize a division range of 128 to 255.

In order to realize a wide division range, a multi-modulus divider may include divider cells that are configured to be bypassed so that different number of divider cells can be selected to realize the desired division ratio. For instance, a multi-modulus divider may include a chain of 7 divider cells with the last two cells (#6 and #7) configured for bypass. The divider will then have a division range of 32 to 255 with the chain of divider cells configured to select 5, 6 or 7 divider cells depending on the desired division ratio. For instance, for a small division ratio, such as between 32 and 63, cells #6 and #7 are bypassed and only five divider cells are used. When a larger division ratio is desired, such as between 64 and 127, cell #7 may be bypassed so that the remaining six divider cells are used. Finally, when an even larger division ratio is desired, such as between 128 and 255, cells #6 and #7 are not bypassed but are used in the chain to generate the desired division ratio.

However, in such a configuration, when division ratio changes cause a change in the number of divider cells needed in the chain, e.g. from n cells to n+1 cells, or from n+1 cells to n+2 cells, and vice versa, the changing number of divider cells often results in a glitch in the divided down clock $CLK_{div}$ during the cell number change-over. The divided down clock signal will be erroneous for at least half the clock cycle. The clock glitch or clock error that occurs during the divider cell change-over is undesirable as the clock glitch can result in a large phase error which may lead to system error that may not be recoverable. A solution to eliminate such clock errors is described in U.S. Pat. No. 7,760,844. However, the solution described in the '844 patent relies on the highest clock frequencies to recover from the clock glitch which means the implementation requires complicated circuitry that has to operate at high frequencies.

Figure 3:
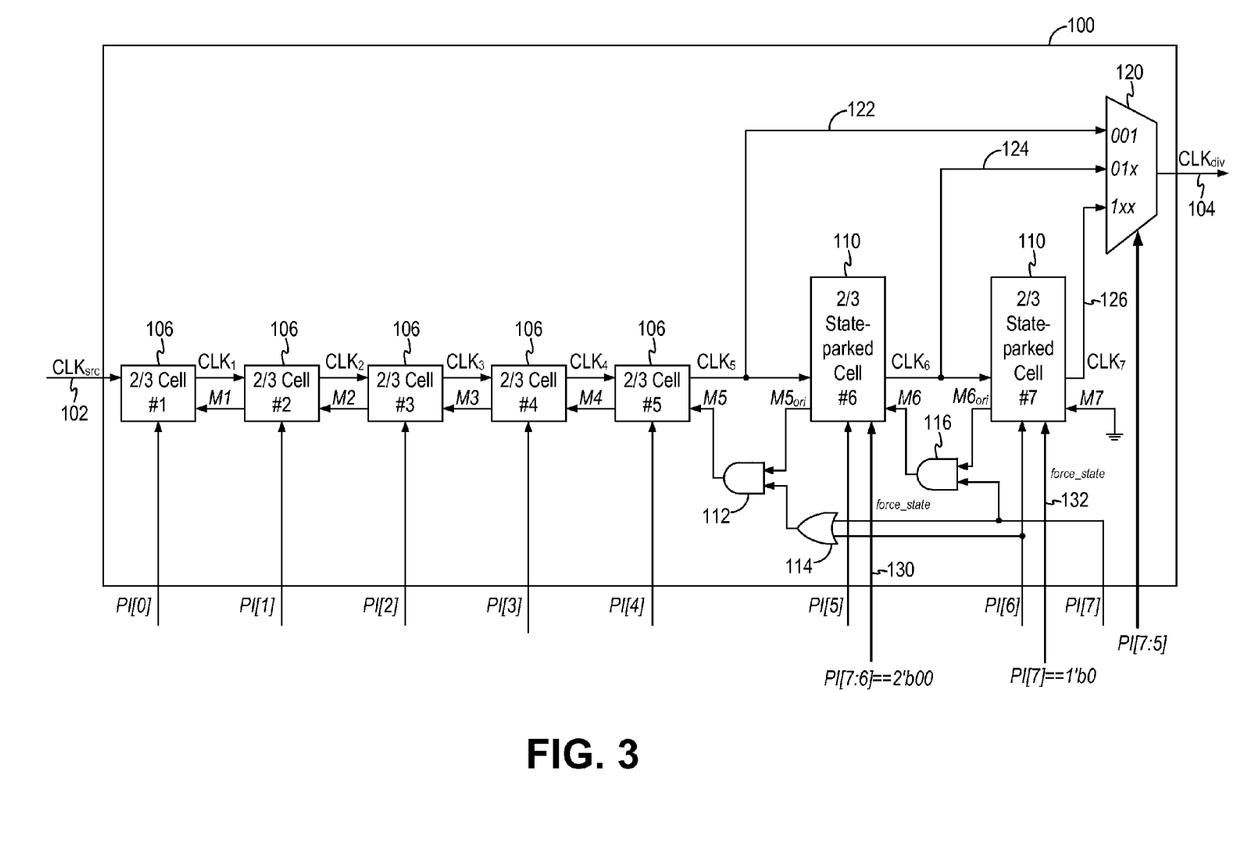
FIG. 3 is a schematic diagram of a feedback divider including state-parked dual modulus divider cells according to embodiments of the present invention.

According to embodiments of the present invention, a multi-modulus divider includes one or more state-parked dual modulus divider cells to eliminate clock glitches in the output feedback clock when changes in division ratio leads to changes in the number of divider cells activated. FIG. 3 is a schematic diagram of a feedback divider including state-parked dual modulus divider cells according to embodiments of the present invention. Referring to FIG. 3, a multi-modulus divider 100 includes a chain of n dual modulus divider cells in cascade and connected in a ripple configuration. More specifically, the multi-modulus divider 100 includes k dual modulus divider cells 106 which are implemented as conventional basic dual modulus P/(P+1) divider cells. In the present embodiment, the basic divider cells 106 are divide-by-2/3 divider cells. The multi-modulus divider 100 further includes (n-k) state-parked dual modulus divider cells 110. The state-parked dual modulus divider cells 110 are configured so that the cells are forced to a specific logical state when not selected so that when the state-parked divider cells 110 are selected, the cells are in the correct logical cell to generate the output clock signals without clock glitches or clock errors. In the present embodiment, the state-parked divider cells 110 are divide-by-2/3 divider cells.

The multi-modulus divider 100 is constructed with the 2/3 basic divider cells 106 at the front end of the chain and the 2/3 state-parked divider cells 110 at the back end of the chain. That is, divider cells #1 to #k are 2/3 basic divider cells 106 with divider cell #1 configured to receive the input source clock signal $CLK_{src}$ (node 102). In the present embodiment, five 2/3 basic divider cells 106 are used in a chain of seven divider cells (i.e., k=5 and n=7) and the fifth cell (2/3 Cell #5) generates an output clock signal $CLK_5$ (node 122) which can be used as the output divided down clock $CLK_{div}$ for division ratio that is within the range generated by five divider cells, such as between 32 and 63.

Divider cells #k+1 to #n are 2/3 state-parked divider cells 110. Each state-parked divider cell 110 can be bypassed through combinational logic formed by logic gates 112, 114 and 116 under the control of the most significant (n-k+1) bits of the programmability bits. That is, programmability bits PI[n:k] are used to select whether to bypass or enable the state-parked divider cells 110. For example, when the division ratio calls for six divider cells, that is, the division ratio is within the range of 64-127, the programmability bits will enable 2/3-parked divider cell #6. When the division ratio calls for seven divider cells, that is, the division ratio is within the range of 128-255, the programmability bits will enable 2/3 state-parked divider cell #6 and #7. In the present embodiment, the programmability bits enable 2/3 state-parked divider cell #6 through OR gate 114 and AND gate 112 and enable 2/3 state-parked divider cell #7 through AND gate 116.

More specifically, when 2/3 state-parked divider cell #6 is to be enabled, the programmability bit PI[6] will be asserted which will assert the output of OR gate 114. The AND gate 112 will then be enabled to pass the modulus signal $M5_{ori}$ through as the modulus signal M5 to 2/3 Cell #5. When 2/3 state-parked divider cell #6 is to be bypassed, the programmability bits PI[6] and PI[7] will be deasserted which will deassert the output of OR gate 114. The AND gate 112 will then be disabled and the modulus signal $M5_{ori}$ will be blocked and will not propagate to 2/3 Cell #5.

When 2/3 state-parked divider cell #7 is to be enabled in addition to 2/3 state-parked divider cell #6, the programmability bits PI[6] and PI[7] will be asserted which will assert the output of OR gate 114 and also enable the AND gate 116. The AND gate 112 will then be enabled to pass the modulus signal $M5_{ori}$ through as the modulus signal M5 to 2/3 Cell #5. The AND gate 116 is also enabled to pass the modulus signal $M6_{ori}$ through as the modulus signal M6 to 2/3 Cell #6. When 2/3 state-parked divider cell #7 is to be bypassed, the programmability bit PI[7] will be deasserted which will disable the AND gate 116 and the modulus signal $M6_{ori}$ will be blocked and will not propagate to 2/3 Cell #6.

When 2/3 state-parked divider cell #6 is enabled, the divider cell #6 generates an output clock signal $CLK_6$ (node 124) which can be used as the output divided down clock $CLK_{div}$ for division ratio that is within the range generated by six divider cells, such as between 64 and 127. When 2/3 state-parked divider cell #7 is enabled, the divider cell #7 generates an output clock signal $CLK_7$ (node 126) which can be used as the output divided down clock $CLK_{div}$ for division ratio that is within the range generated by seven divider cells, such as between 128 and 255.

The multi-modulus divider 100 includes a multiplexer 120 for selecting between the three possible clock signals as the output divided down clock $CLK_{div}$ (node 104) based on the programmability bits PI[n:k]. In the present embodiment, the multiplexer 120 receives the programmability bits PI[7:5] as the selection bits. When the programmability bits PI[7:5] have the value of "001" indicating that cell #6 and cell #7 are to be bypassed and only the first five divider cells are to be enabled, the multiplexer 120 selects the output clock $CLK_5$ from 2/3 divider cell #5 (node 122). When the programmability bits PI[7:5] have the value of "01x" indicating that cell #7 is to be bypassed and six divider cells are to be enabled, the multiplexer 120 selects the output clock $CLK_6$ from 2/3 state-parked divider cell #6 (node 124). When the programmability bits PI[7:5] have the value of "1xx" indicating that all seven divider cells are to be enabled, the multiplexer 120 selects the output clock $CLK_7$ from 2/3 state-parked divider cell #7 (node 126).

According to embodiments of the present invention, the multi-modulus divider 100 includes one or more state-parked divider cells as the last divider cells where the state-parked divider cells are forced to a known logical state when they are not selected. In some embodiments, a state-parked divider cell 110, when not enabled, is forced to a logical state that allows the divider cell to go into a divide-by-2 state or a divide-by-3 state as soon as the divider cell is enabled. Furthermore, the clock output and modulus signal output of the state-parked divider cell are forced to a known logical state when the divider cell is not enabled. Then, when a state-parked divider cell is enabled due to a change in the division ratio, the state-parked divider cell is in the correct logical state to generate the correct output clock and correct modulus signal output as the last cell in the chain. In this manner, no clock glitch occurs during the change-over between different numbers of divider cells.

In particular, in multi-modulus divider 100, the modulus signal Mx is generated at the last cell and propagates from the last cell. That is, when five divider cells are selected, the modulus signal Mx is generated by cell #5; when six divider cells are selected, the modulus signal Mx is generated by cell #6; and when seven divider cells are selected, the modulus signal Mx is generated by cell #7. When the changes in division ratio cause changes in the number of divider cells, the divider cell that would be the last cell changes. For example, when the division ratio changes from 60 to 66, the number of divider cells changes from 5 to 6 and the last cell becomes cell #6 instead of cell #5. When cell #6 is enabled with unknown logical states, the output clock and the modulus output signal of cell #6 may be in the wrong logical state, leading to counting errors and clock glitches.

More specifically, the state-parked divider cell 110 is forced to a state that would enable a glitch-free transition when the additional state-parked divider cells are enabled into the chain. In the present embodiment, a state-parked divider cell 110, when not enabled as indicated by the programmability bits, is forced to a logical state that allows the divider cell to go into a divide-by-2 state or a divide-by-3 state as soon as the divider cell is enabled. As a result, the output clock and the modulus output signal are thus forced to a logical high value when the state-parked divider cell is not selected. As thus configured, when division ratio changes lead to a change in the last divider cell being used, the state-parked divider cell 110 being enabled can immediately move into a divide-by-2 or divide-by-3 state to continue the division operation of the divider. Furthermore, the state-parked divider cell will be in the correct logical state to generate the output clock and to propagate the modulus signal. The divided down clock $CLK_{div}$ can be generated without clock errors. The operation of the state-parked divider cells does not require any clocking circuitry as the force-state condition is self-aligned to the programmability bits.

In embodiments of the present invention, the state-parked divider cell 110 receive a force_state input signal operative to force the internal states of the cell to a known logical state which also forces the output clock and the modulus output signal to a logical high value. In operation, the chain of divider cells has the modulus signal set at a normally logical high state and a logical low modulus signal is propagated down from the last divider cell. By forcing the modulus output signal to a logical high value, the state-parked divider cell 110 is prevented from propagating an erroneous modulus signal. More specifically, as described above, when the modulus signal Mx received by a divider cell #x has a logical high value, the divider cell #x will divide by 2 always. On the other hand, when the modulus signal Mx received by a divider cell #x has a logical low value, the divider cell #x will divide by 2 or by 3 depending on the programmability bit PI[x]. The divider cell #x will divide by 3 only when enabled by the programmability bit PI[x].

The force_state input signal is driven by the programmability bits indicating that the divider cell 110 is not being selected. For example, for cell #6, the programmability bits PI[7:6] are used as the force_state input signal (node 130). When the programmability bits PI[7:6] have the value of "00" indicating neither cell #6 nor cell #7 is selected, the force_state input signal (node 130) for cell #6 will be activated to force the divider cell to the desired logical state. For cell #7, the programmability bit PI[7] is used as the force_state input signal (node 132). When the programmability bit PI[7] have the value of "0" indicating cell #7 is not selected, the force_state input signal (node 132) for cell #7 will be activated to force the divider cell to the desired logical state. In general, the force_state input signal is formed by the programmability bit associated with the state-parked divider cell and the programmability bits for any higher order divider cells.

Figure 4:
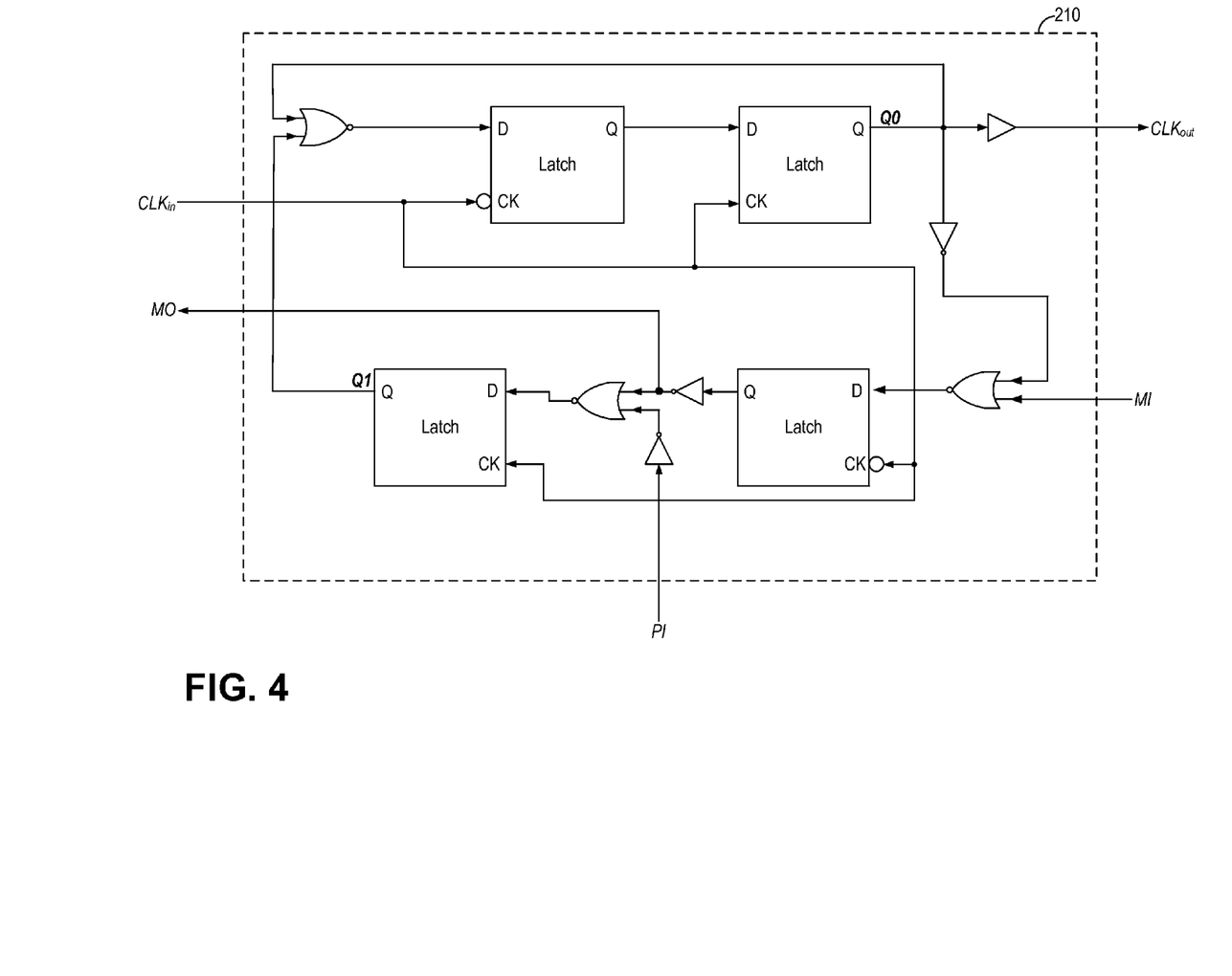
FIG. 4 is a schematic diagram of a basic dual modulus divider cell according to embodiments of the present invention.

FIG. 4 is a schematic diagram of a basic dual modulus divider cell according to embodiments of the present invention. The basic dual modulus divider cell receives an input clock CLKin and a modulus input signal MI and generates an output clock CLKout and a modulus output signal MO.

Figure 5:
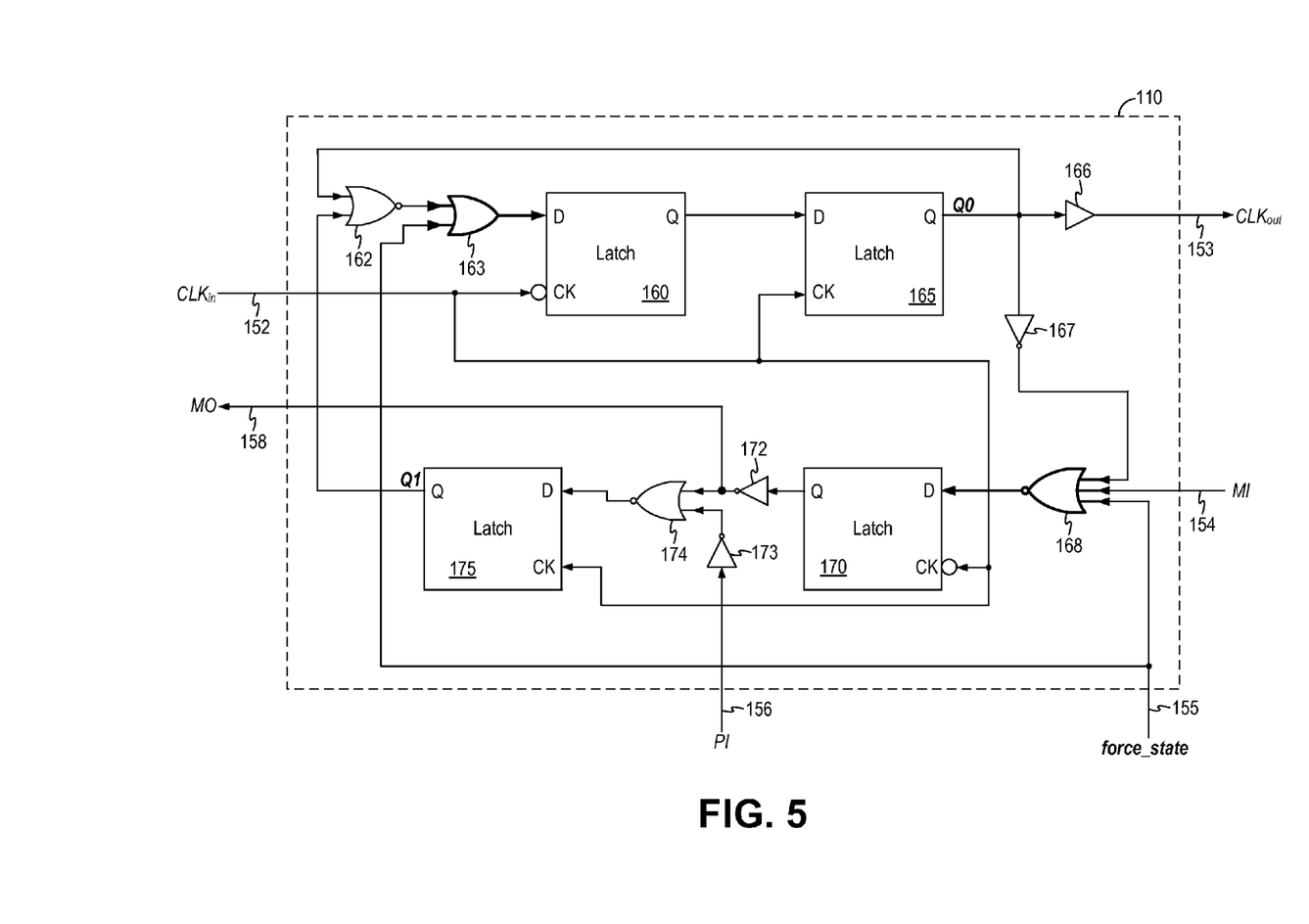
FIG. 5 is a schematic diagram of a dual modulus state-parked divider cell according to one embodiment of the present invention.

FIG. 5 is a schematic diagram of a dual modulus state-parked divider cell according to one embodiment of the present invention. Referring to FIG. 5, a dual modulus state-parked divider cell 110 includes a latch 160 and a latch 165 connected in cascade to receive the input clock $CLK_{in}$ (node 152) and to generate the output clock $CLK_{out}$ (node 153). The Q output of the latch 165 is a Q0 signal which is coupled to a NOR gate 162 as feedback and also coupled through an inverter 67 to an NOR gate 168. The state-parked divider cell 110 further includes a latch 170 and a latch 175 connected in cascade to receive the input modulus signal MI (node 154) and to generate the output modulus signal MO (node 158). The Q output of the latch 175 is a Q1 signal which is coupled to the NOR gate 162 driving the latch 160. The programmability bit PI is coupled through an inverter 173 and an OR gate 174 to drive the data input of the latch 175.

The configuration and operation of the divider cell 110 is similar to the basic divider cell of FIG. 4 except for the addition of the force_state input signal (node 155) to the NOR gate 168 and the addition of the OR gate 163 also receiving the force_state input signal. As thus configured, when the force_state input signal is at a logical low level, the logical states of signals Q1 and Q0 will be 0 and 1, respectively. That is, {Q1, Q0}={01}. Then, the output clock CLKout (node 153) will be forced to a logical high value based on the Q0 signal and the modulus output signal MO (node 158) will also be forced to a logical high value. based on the Q0 signal. By setting the signals Q1 and Q0 to {01}, the divider cell is set to either divide-by-2 or divide-by-3 when the cell is enabled. More specifically, when the divider cell is enabled to divide-by-2, the signals Q1, Q0 will move from {01} to {00} which is reset. When the divider cell is enabled to divide-by-3, the signals Q1, Q0 will move from {01} to {10} and then to {00} for reset. The logical state of {Q1, Q0}={01} is thus the branching state. By parking the divider cell 110 at this branching state, the divider cell can move immediately into divide-by-2 or divide-by-3 without going through erroneous logic states. if the divider cell is not set at the correct logical state, it may take another clock cycle before the divider cell is put in the correct state, causing clock errors.

Figure 6:
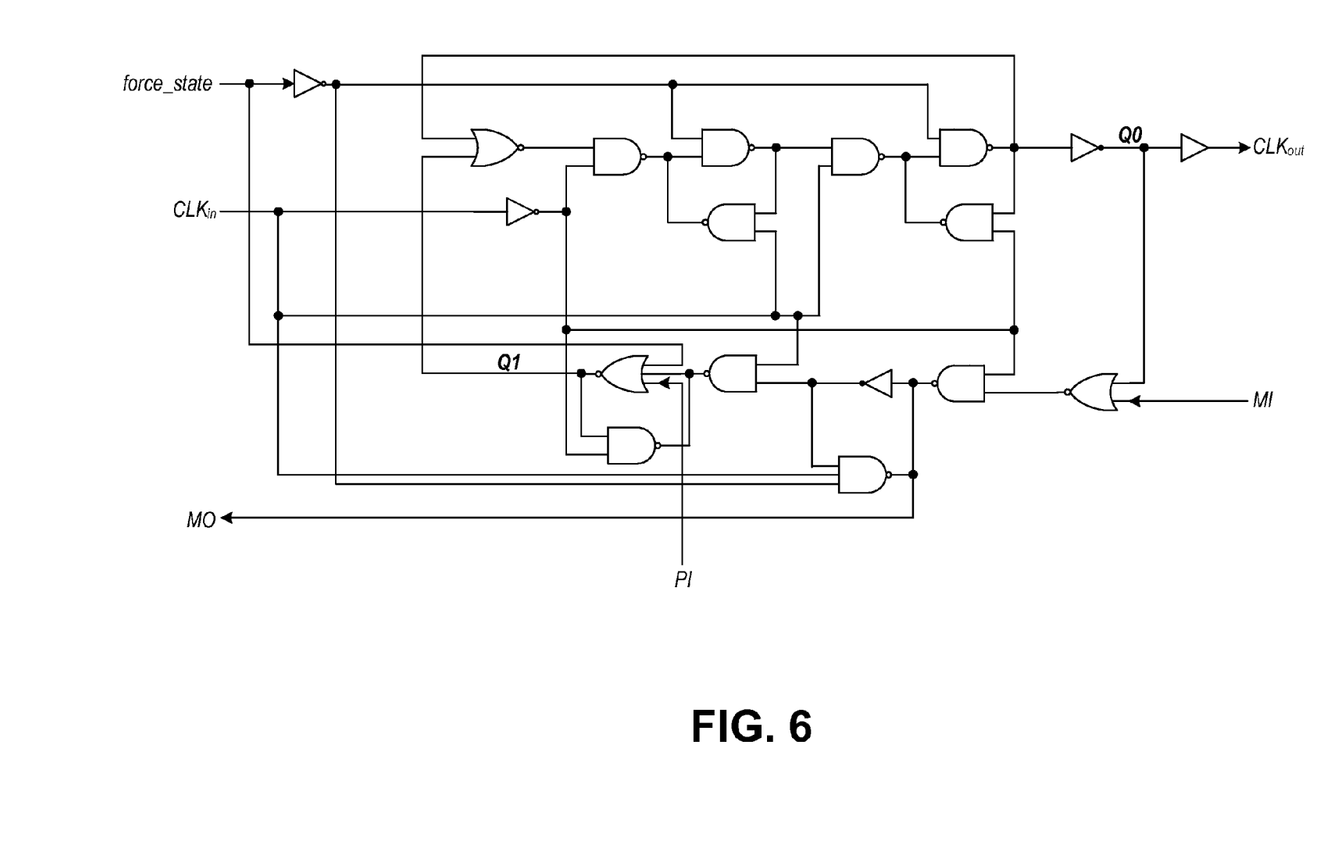
FIG. 6 is a schematic diagram of a dual modulus state-parked divider cell according to an alternate embodiment of the present invention.

FIG. 5 illustrates a conceptual implementation of the state-parked divider cell 110 incorporating the force_state input signal to set the divider cell to a known logical state when not enabled. FIG. 6 is a schematic diagram of a dual modulus state-parked divider cell according to an alternate embodiment of the present invention. In the embodiment shown in FIG. 6, the force_state input signal is incorporated into the latch circuits to implement the state parking.

The multi-modulus divider of the present invention incorporating state-parked divider cells realizes many advantages over conventional multi-modulus dividers. The multi-modulus divider of the present invention is capable of implementing a wide-range division ratio with changing number of divider cells without clock errors. The multi-modulus divider requires only lower speed control signals and the control signals can be generated by pure combinational circuitry. The multi-modulus divider does not require high speed clock signals or complex circuitry often required in conventional solutions.

The above detailed descriptions are provided to illustrate specific embodiments of the present invention and are not intended to be limiting. Numerous modifications and variations within the scope of the present invention are possible. The present invention is defined by the appended claims.

We claim:

1. A multi-modulus divider receiving an input clock signal and generating a divided-down clock signal, comprising:
   n dual modulus divider cells connected in cascade and ripple configuration, the first k out of n divider cells comprising k basic dual modulus divider cells and the last (n-k) divider cells comprising (n-k) state-parked dual modulus divider cells being able to be bypassed, each state-parked dual modulus divider cells receiving a control signal to set the state-parked dual modulus divider cell to a predetermined logical state when the state-parked dual modulus divider cell is being bypassed; and
   a multiplexer having input terminals receiving an output clock signal from the kth divider cell and output clock signals from each of the (n-k) state-parked dual modulus divider cells, the multiplexer receiving a selection signal to select one of the output clock signals as the divided-down clock signal,
   wherein the divided-down clock signal is generated based on the input clock signal and a division ratio, the division ratio determining when one or more (n-k) state-parked dual modulus divider cells are to be bypassed, and wherein the control signal to set the state-parked dual modulus divider cell to a predetermined logical state and the selection signal of the multiplexer are derived from programmability bits provided to each divider cell to select the division factor of the dual modulus divider cells.

2. The multi-modulus divider of claim 1, wherein the control signal to set a state-parked dual modulus divider cell to a predetermined logical state comprises the programmability bit for that divider cell and the programmability bits for any higher order divider cells.

3. The multi-modulus divider of claim 1, wherein the selection signal of the multiplexer comprises the programmability bits for the k to n divider cells.

4. The multi-modulus divider of claim 1, wherein the n dual modulus divider cells comprises n P/(P+1) divider cells, each divider cell receiving a respective programmability bit to select P or (P+1) as the division factor of the divider cell, the divider cell enabling the (P+1) division factor when a modulus input signal to the divider cell is simultaneously asserted.

5. The multi-modulus divider of claim 4, wherein the state-parked dual modulus divider cell, in response to the control signal, is set to a logical state that enables the state-parked divider cell to go into a divide-by-P state or a divide-by-(P+1) state when the divider cell is enabled.

6. The multi-modulus divider of claim 4, wherein the state-parked dual modulus divider cell, in response to the control signal, has a modulus output signal and an output clock signal set to a first logical state where the modulus output signal has the first logical state to select a divide-by-P for the divider cell.

7. A method for performing frequency division using a multi-modulus divider, the method comprising:
   providing n dual modulus divider cells connected in cascade and ripple configuration with the last (n-k) divider cells being able to be bypassed;
   providing a control signal to set one or more of the last (n-k) divider cells to a predetermined logical state based on programmability bits provided to each divider cell to select the division factor of the dual modulus divider cells;
   in response to the control signal, setting one or more of the last (n-k) divider cells to a predetermined logical state when the one or more divider cells are being bypassed;
   selecting an output clock signal from the kth divider cell and output clock signals from each of the last (n-k) divider cells as the divided-down clock signal in response to a selection signal, the selection signal being derived from the programmability bits; and
   generating the divided-down clock signal based on the input clock signal and a division ratio, the division ratio determining when one or more of the last (n-k) divider cells are to be bypassed.

8. The method of claim 7, wherein providing a control signal comprises providing the programmability bit for that divider cell and the programmability bits for any higher order divider cells as the control signal.

9. The method of claim 7, further comprises:
   providing the programmability bits for the k to n divider cells as the selection signal.

10. The method of claim 7, wherein the n dual modulus divider cells comprises n P/(P+1) divider cells, each divider cell receiving a respective programmability bit to select P or (P+1) as the division factor of the divider cell, the divider cell enabling the (P+1) division factor when a modulus input signal to the divider cell is simultaneously asserted.

11. The method of claim 10, wherein setting one or more of the last (n-k) divider cells to a predetermined logical state when the one or more divider cells are being bypassed comprises setting one or more of the last (n-k) divider cells to a logical state that enables the divider cell to go into a divide-by-P state or a divide-by-(P+1) state when the divider cell is enabled.

12. The method of claim 10, wherein setting one or more of the last (n-k) divider cells to a predetermined logical state when the one or more divider cells are being bypassed comprises setting a modulus output signal and an output clock signal of the divider cell to a first logical state where the modulus output signal has the first logical state to select a divide-by-P for the divider cell.

* * * * *